(12) United States Patent  
Kimata

(10) Patent No.: US 7,046,968 B2  
(45) Date of Patent: May 16, 2006

(54) FREQUENCY CORRECTING METHOD FOR CELLULAR PHONE TERMINAL

(75) Inventor: Yusuke Kimata, Tokyo (JP)

(73) Assignee: NEC Corporation, Tokyo (JP)

( * ) Notice: Subject to any disclaimer, the term of this patent is extended or adjusted under 35 U.S.C. 154(b) by 385 days.

(21) Appl. No.: 10/230,170

(22) Filed: Aug. 29, 2002

(65) Prior Publication Data

US 2003/0045259 A1    Mar. 6, 2003

(30) Foreign Application Priority Data

Aug. 31, 2001   (JP)   ............................. 2001-263051

(51) Int. Cl.
*H04B 1/00*   (2006.01)
*H04B 7/00*   (2006.01)

(52) U.S. Cl. ................... 455/71; 455/192.2; 455/260

(58) Field of Classification Search ................ 455/69, 455/70, 71, 192.1, 192.2, 196.1, 256, 257, 455/255, 258, 259, 260, 265; 375/344

See application file for complete search history.

(56) References Cited

U.S. PATENT DOCUMENTS

| | | | | |
|---|---|---|---|---|
| 3,918,003 A | * | 11/1975 | Seidel | .................... 330/279 |
| 4,932,072 A | | 6/1990 | Toko | |
| 5,065,451 A | * | 11/1991 | Leveque | ...................... 455/72 |
| 5,115,515 A | * | 5/1992 | Yamamoto et al. | ........... 455/71 |
| 5,479,136 A | | 12/1995 | Endo et al. | |
| 5,493,710 A | | 2/1996 | Takahara et al. | |
| 5,740,525 A | * | 4/1998 | Spears | ....................... 455/259 |
| 5,848,376 A | * | 12/1998 | Steiner et al. | ............. 701/213 |
| 5,852,641 A | | 12/1998 | Hagmanns | |
| 5,940,744 A | | 8/1999 | Uda | |
| 6,081,702 A | * | 6/2000 | Serfaty et al. | .............. 455/264 |
| 6,349,196 B1 | * | 2/2002 | Bourzeix | ...................... 455/42 |
| 6,625,434 B1 | | 9/2003 | Arimitsu et al. | |
| 6,704,556 B1 | * | 3/2004 | Eaton et al. | ................. 455/260 |

FOREIGN PATENT DOCUMENTS

| | | |
|---|---|---|
| GB | 2 273 405 | 6/1994 |
| JP | 61-251240 | 11/1986 |
| JP | 04-150423 | 5/1992 |
| JP | 5-167468 | 7/1993 |
| JP | 07-307645 | 11/1995 |
| JP | 9-326752 | 12/1997 |
| JP | 10-41786 | 2/1998 |
| JP | 2000-115056 | 4/2000 |
| JP | 2000-196516 | 7/2000 |
| JP | 2000-209128 | 7/2000 |
| JP | 2000-286910 | 10/2000 |

\* cited by examiner

*Primary Examiner*—Nguyen T. Vo
(74) *Attorney, Agent, or Firm*—Foley & Lardner LLP

(57) ABSTRACT

When a cellular phone terminal is powered on, it immediately receives a reference signal (non-modulated reference frequency signal for correcting a crystal oscillation circuit) for correcting the reception frequency of a radio signal transmitted from a base station at all times, and corrects the error of the reception frequency on the basis of the reference signal received. After the error of the reception frequency is corrected, the cellular phone terminal makes normal communications with the base station.

12 Claims, 7 Drawing Sheets

FREQUENCY CORRECTING METHOD FOR CELLULAR PHONE TERMINAL

BACKGROUND OF THE INVENTION

1. Field of the Invention

The present invention relates to a cellular phone terminal with which the reception frequency is corrected on the basis of a reference signal transmitted from a base station, and to a frequency correcting method for the cellular phone terminal.

2. Description of the Related Art

TCXO (Temperature-Compensated Crystal Oscillator) which can generate a high-precision frequency having an error of ±3 ppm (volume parts per million), for example, has been hitherto used as an oscillator to receive/transmit radio signals with high precision in a cellular phone terminal.

In connection with recent widespread use of cellular phone terminals, it has been required to reduce the cost of the cellular phone terminals. Particularly, it has been strongly required to reduce the cost of a radio portion having the highest maturity among the parts constituting each cellular phone terminal. TCXO occupies a relatively large cost in the radio portion and thus it has been required to get an inexpensive crystal oscillator as a replacement for TCXO. However, such an inexpensive crystal oscillation circuit has a disadvantage that it has a large frequency error of ±50 ppm or more and thus it is unfavorable for the cellular phone terminals which receive/transmit radio signals with high precision.

SUMMARY OF THE INVENTION

Therefore, the present invention has an object to enable use of an inexpensive crystal oscillation circuit having a low frequency-error precision in a cellular phone terminal.

In order to attain the above object, according to a first aspect of the present invention, there is provided a frequency correcting method in a cellular phone terminal for communicating a radio signal with a base station, comprising: a first step of receiving a reference signal for correcting the reception frequency of the radio signal transmitted from the base station after powered on; a second step of correcting the reception frequency on the basis of the reference signal received through the processing of the first step; and a third step of making normal communications with the base station after the processing of the second step.

Further, according to a second aspect of the present invention, there is provided a frequency correcting method in a cellular phone terminal for communicating a radio signal with a base station, comprising: a first step of receiving a reference signal for correcting the reception frequency of the radio signal transmitted from the base station when the cellular phone terminal is on standby.; a second step of correcting the reception frequency on the basis of the reference signal received through the processing of the first step; and a third step of shifting to the normal communications with the base station after the processing of the second step.

Further, according to a third aspect of the present invention, there is provided a cellular phone terminal for communicating a radio signal with a base station, comprising: a radio reception portion for receiving the radio signal transmitted from the base station and demodulating the received radio signal, a base band portion for measuring the frequency error of the demodulated signal, a crystal oscillation circuit portion, control means for bringing the frequency of the frequency signal outputted from the crystal oscillation circuit portion into correspondence with the frequency of a reference signal, the reference signal correcting the reception frequency of the radio signal, first frequency correction portion for supplying the crystal oscillation circuit portion with the voltage for correcting the frequency error outputted from the base band portion while receiving the reference signal transmitted from the base station, second frequency correction portion for supplying the crystal oscillation circuit portion with the voltage for correcting the frequency error outputted from the base band portion under the normal communications which the radio reception portion receives the radio signal, and synthesizer portions for correcting the frequency error of the radio reception portion on the basis of the frequency signal outputted from the crystal oscillation circuit portion.

DETAILED DESCRIPTION OF THE PREFERRED EMBODIMENTS

Preferred embodiments according to the present invention will be described hereunder with reference to the accompanying drawings.

Figure 1:
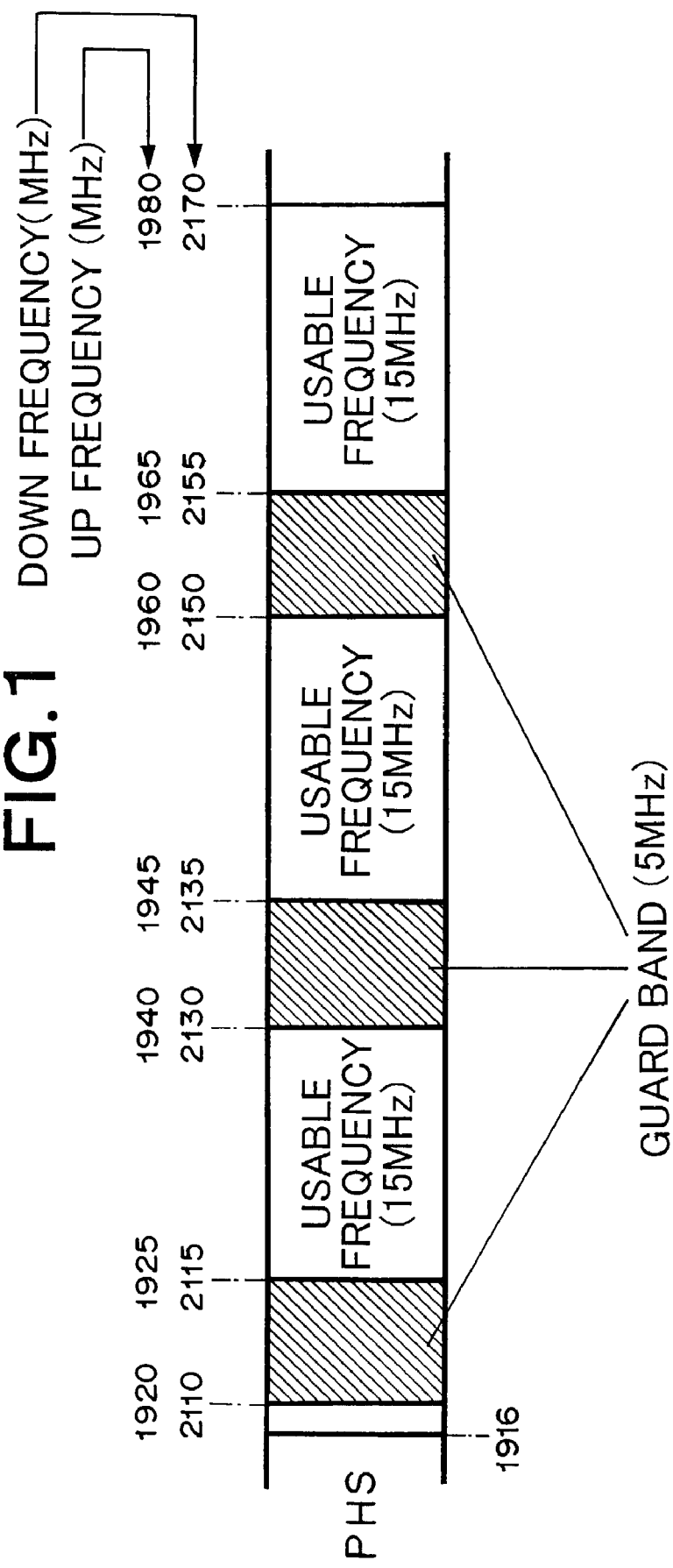
FIG. 1 is a diagram showing the condition of a frequency band used by a portable terminal device to which the present invention is applied.

FIG. 1 is a diagram showing a frequency band used by a cellular phone terminal to which the present invention is applied. The cellular phone terminal is used in a next-generation mobile communication system called as "IMT 2000 (International Mobile Communication 2000)". As shown in FIG. 1, for the IMT 2000 service frequency used in the next-generation mobile communication system are provided 5 MHz (from 1920 to 1925 MHz) band serving as a guard band (buffer band) for preventing interference from PHS (Personal Handyphone System; PHS is developed on the basis of a digital code-less phone in Japan), 5 MHz (from 1940 to 1945 MHz, from 1960 to 1965 MHz) bands serving as guard bands as a result of pursuance carried out from the standpoint of fairness, and 5 MHz (from 2110 to 2115 MHz, from 2130 to 2135 MHz, from 2150 to 2155 MHz) bands as guard bands of the reception frequency for the cellular phone terminal in connection with provision of the 5 MHz (from 1940 to 1945 MHz, from 1960 to 1965 MHz) bands as the guard band.

15 MHz from 1925 to 1940 MHz, 15 MHz from 1945 to 1960 MHz and 15 MHz from 1965 to 1980 MHz are allocated as the transmission frequency band (that is, up frequency band) in the cellular phone terminal, and 15 MHz from 2115 to 2130 MHz, 15 MHz from 2135 to 2150 MHz and 15 MHz from 2155 to 2170 MHz are allocated as the reception frequency band (that is, down frequency band) in the cellular phone terminal.

The cellular phone terminal is equipped with a crystal oscillation circuit comprising a crystal oscillator which is cheaper than TCXO (Temperature Compensated Crystal Oscillator) generally used in a cellular phone terminal, but has less frequency precision than TCXO, and AFC (Automatic Frequency Control) circuit for the crystal oscillation circuit for performing the frequency correction of the crystal oscillation circuit. On the assumption that a non-modulated reference frequency signal (reference signal) for correction of a crystal oscillation circuit is transmitted from a base station into the guard band 5 MHz of the reception frequency for the cellular phone terminal, for example, high-precision non-modulated waves (signal) of 2132.5 MHz are transmitted from a base station (not shown) at all times, the signal of 2132.5 MHz is received as a reference frequency for correcting the crystal oscillation circuit when the cellular phone terminal is powered on, and the AFC circuit for the crystal oscillation circuit corrects the frequency of the crystal oscillation circuit on the basis of the reference frequency for correcting the crystal oscillation circuit.

Figure 2:
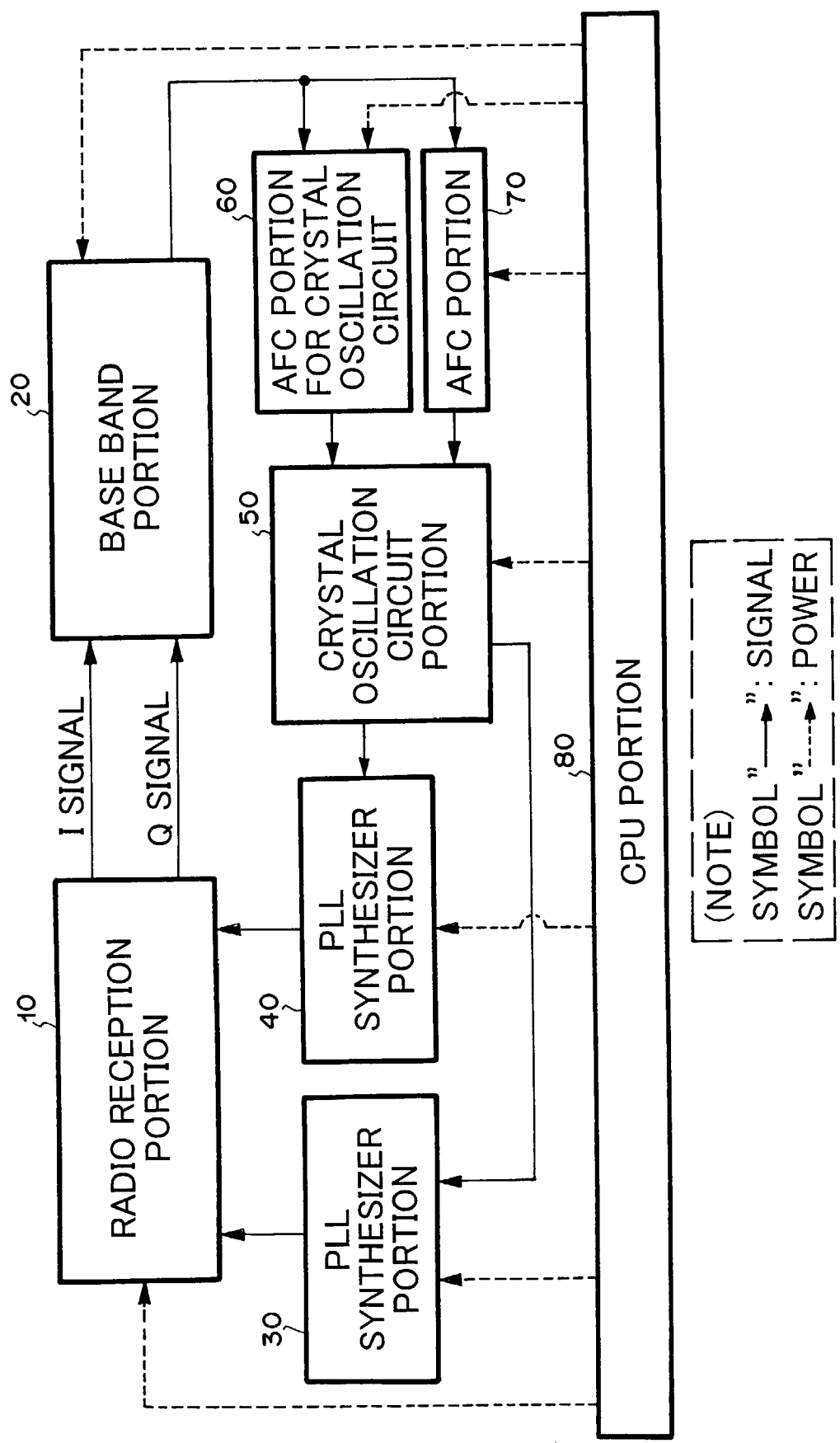
FIG. 2 is a block diagram showing the construction of the main part of the portable terminal device.

FIG. 2 is a block diagram showing the construction of the main part of the cellular phone terminal.

As shown in FIG. 2, the cellular phone terminal comprises radio reception portion 10 containing an antenna, a duplexer, LNA (Low Noise Amplifier), a RF band bass filter, an IF mixer, an IF band pass filter and a demodulator, base band portion 20 for performing power measurement of desired signals I, Q and calculation of a frequency error, down-conversion PLL synthesizer portion 30 containing VCO (Voltage Controlled Oscillator) and a loop filter, demodulation PLL synthesizer portion 40 containing VCO and a loop filter, crystal oscillation circuit portion 50 comprising a crystal oscillator for supplying a reference frequency to the PLL synthesizer portions 30 and 40, an AFC portion 60 for the crystal oscillation circuit which supplies the crystal oscillation circuit portion 50 with the voltage corresponding to the frequency error value calculated and outputted by the base band portion 20, an AFC portion 70, and CPU portion 80 for controlling the radio reception portion 10, the base band portion 20, the PLL synthesizer portions 30 and 40, the AFC portion 60 for the crystal oscillation circuit and the AFC portion 70 described above.

Figure 4:
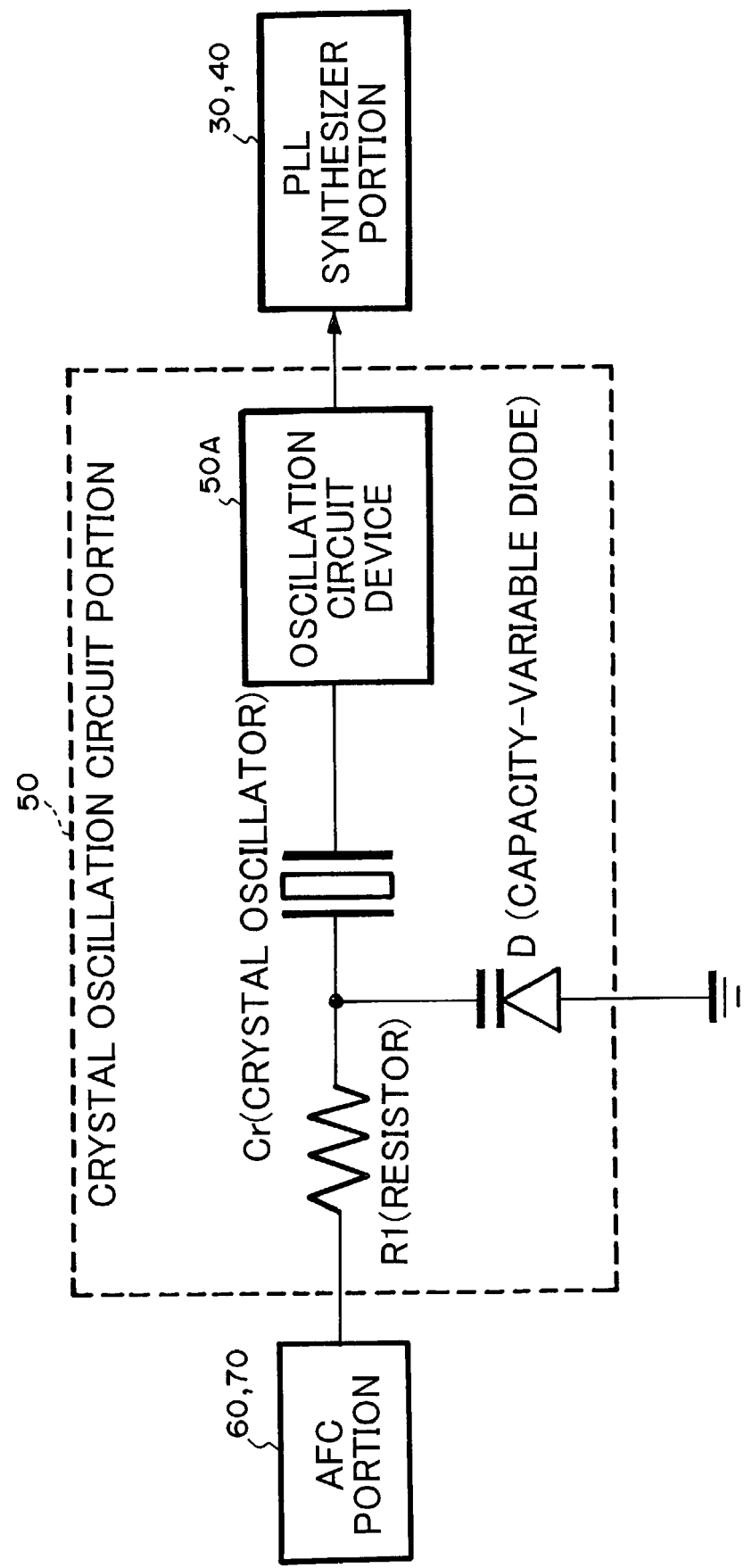
FIG. 4 is a block diagram showing the construction of a crystal oscillation circuit portion of the portable terminal device.
Figure 5:
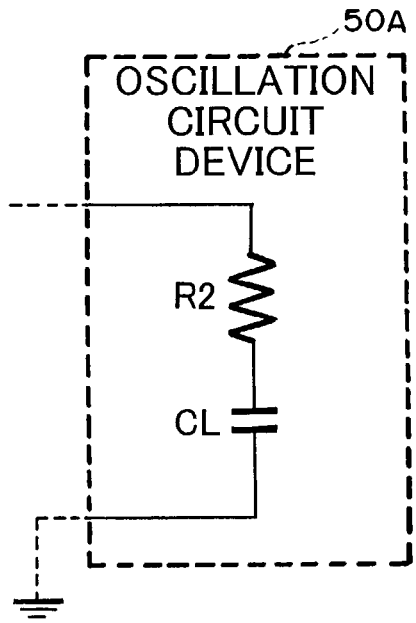
FIG. 5 is an equivalent circuit diagram of an oscillating circuit device of the crystal oscillation circuit portion.

FIG. 4 is a diagram showing the internal construction of the crystal oscillation circuit portion 50. The crystal oscillation circuit portion 50 comprises resistor R1, crystal oscillator Cr, capacitance-variable diode D and an oscillating circuit device 50A. Here, the oscillating circuit device 50A is constructed as shown in the equivalent circuit diagram of FIG. 5. That is, the oscillating circuit device 50A comprises resistor R2 and capacitance CL.

Figure 6:
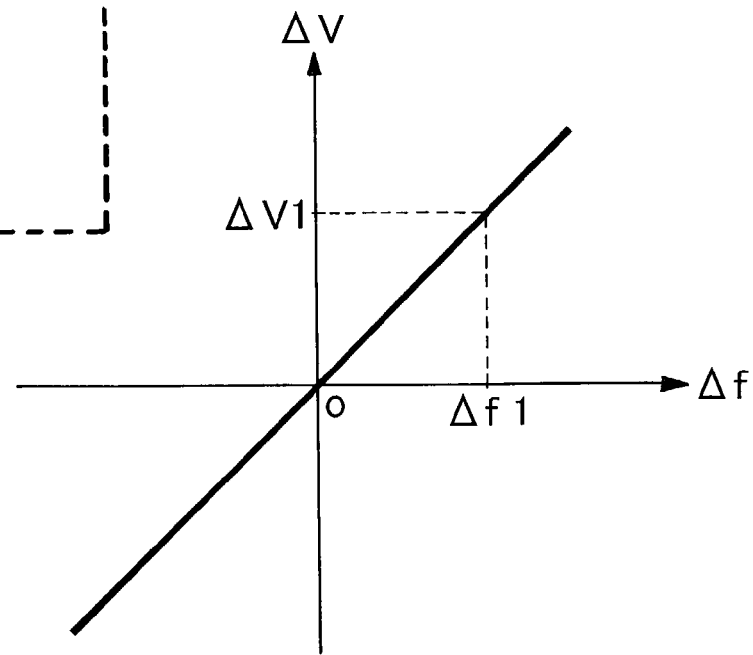
FIG. 6 is a graph showing the relationship between the error of an input voltage and the error of an output frequency in the crystal oscillation circuit portion.

FIG. 6 is a graph showing the relationship between voltage error $\Delta V$ and frequency error $\Delta f$ in the crystal oscillation circuit portion 50. The voltage error inputted to the crystal oscillation circuit portion 50 and the frequency error outputted from the crystal oscillation circuit portion 50 are in direct proportion to each other as shown in FIG. 6. Voltage error $\Delta V1$ and frequency error $\Delta f1$ are one voltage error value and one frequency error value, respectively.

Figure 3:
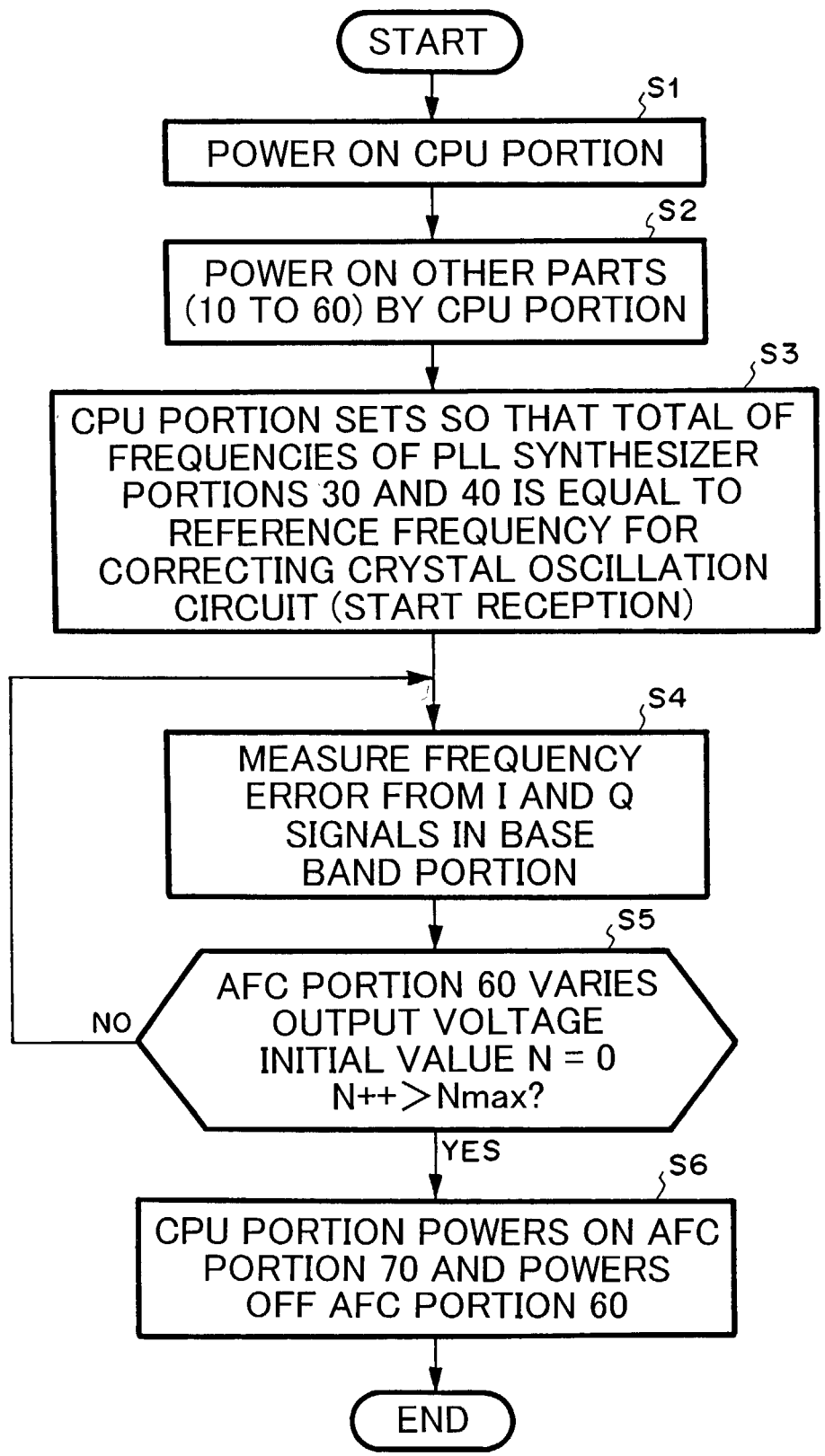
FIG. 3 is a flowchart showing a first operation of the portable terminal device.

FIG. 3 is a flowchart showing the operation when the voltage value outputted from the AFC portion 60 for the crystal oscillation circuit to the crystal oscillation circuit portion 50 on the basis of the reference frequency for the correction of the crystal oscillation circuit is adjusted to correct the output frequency of the crystal oscillation circuit portion 50. The operation of an embodiment according to the method of the present invention will be described hereunder with reference to the flowchart of FIG. 3 and FIGS. 2 to 8.

When the power source switch (not shown) of the cellular phone terminal is turned on in step S1 of FIG. 3, the power source for CPU portion 80 is turned on, so that power is supplied to the CPU portion 80. When the CPU portion 80 is supplied with power to start its operation, the power source for the radio reception portion 10, the base band portion 20, the PLL synthesizer portions 30 and 40, the crystal oscillation circuit portion 50 and the AFC portion 60 for the crystal oscillation circuit is turned on in step S2.

Next, in step S3, the CPU portion 80 matches local frequencies for reception corresponding to the outputs of the PLL synthesizer portions 30 and 40 with the reference frequency for the crystal oscillation circuit transmitted from a base station (not shown) to start the reception of radio signals transmitted from the base station. That is, if the reference frequency for the crystal oscillation circuit transmitted from the base station is equal to 2132 MHz for example, the CPU portion 80 supplies the crystal oscillation circuit portion 50 with such a voltage value that the output frequency of the crystal oscillation circuit portion 50 is equal to 2132 MHz, thereby setting the output frequency to 2132 MHz. Accordingly, the output frequency of the PLL synthesizer portion 30 is set to about 2512 MHz, and the output frequency of the PLL synthesizer portion 40 is set to about 380 MHz. Total of the output frequency of the PLL synthesizer portion 30 and the output frequency of the PLL synthesizer portion 40 is equal to the reference frequency for correcting the crystal oscillation circuit (2132 MHz=2512 MHz−380 MHz). The radio reception portion 10 receives and demodulates the radio signals from the base station side on the basis of the output frequencies from the PLL synthesizer portions 30, 40, and demodulates, and outputs the demodulation signal. In this case, the output of the radio reception portion 10, that is, the demodulated signals I, Q become direct current or sine wave of low frequency occurring due to a frequency error of the crystal oscillation circuit portion 50.

Next, in step S4, the base band portion 20 measures the frequency errors of the signals I, Q (I, Q signals) demodulated by the radio reception portion 10 according to a measurement method described later. In the subsequent step S5, the AFC portion 60 for the crystal oscillation circuit is supplied with the frequency error measured by the base band portion 20, and varies a crystal-oscillation-circuit controlling voltage according to the frequency error. That is, the AFC portion 60 for the crystal oscillation circuit supplies the crystal oscillating circuit portion 50 with the crystal-oscillation-circuit controlling voltage with which the frequency error is corrected. Accordingly, the oscillation frequency whose frequency error is equal to "0" is outputted from the crystal oscillating circuit portion 50, and the signals having a frequency whose frequency error is equal to "0" are outputted from the PLL synthesizer portions 30, 40 in which the signals of the frequency corresponding to the output of the crystal oscillation circuit portion 50 are generated. By repetitively executing each processing of the steps S4, S5 at a preset number of times ($N_{max}$), the frequency errors of the demodulated signals I, Q of the radio reception portion 10 for receiving and demodulating the radio signals on the basis of the output frequencies of the PLL synthesizer portions 30, 40 can be reduced to "0". In the AFC portion 60, an execution number of times (N) is set to "N=0" at the start, and the steps S4, S5 are executed at a preset number of times ($N_{max}$).

If the processing of the step S4 and the processing of the step S5 are repetitively executed at the preset number of times (an execution number of times (N++) is larger than the preset number of times ($N_{max}$), that is, N++>$N_{max}$), the CPU portion 80 recognizes that the reception frequency of the radio reception portion 10 has been sufficiently corrected. Therefore, the CPU portion 80 powers on the AFC portion 70 and powers off the AFC portion 60 for the crystal oscillation circuit in step S6, thereby shifting to the normal communication state under the control of the AFC portion 70.

Figure 7:
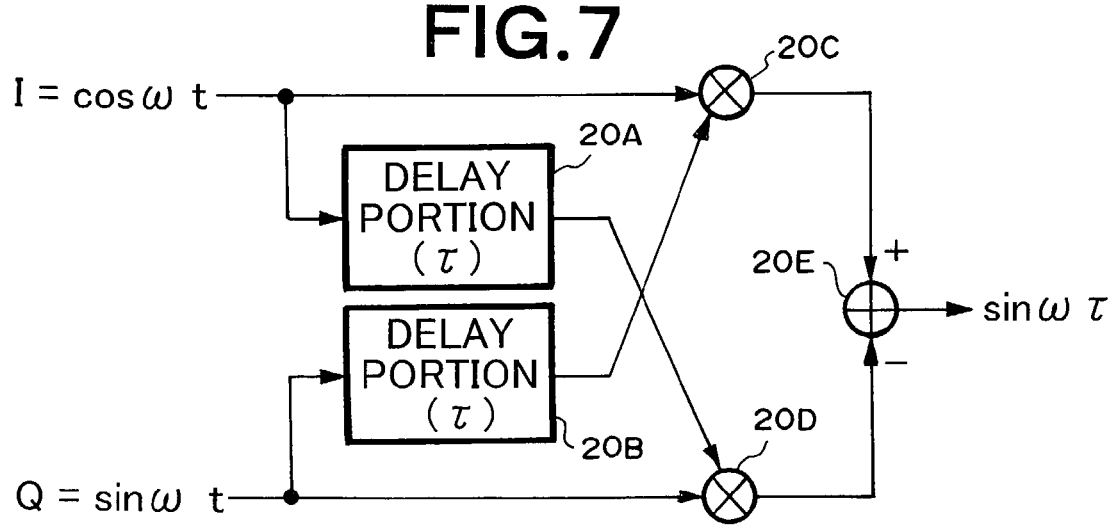
FIG. 7 is a block diagram showing the construction of the main part of a base band portion of the portable terminal device.

Next, an example of the measurement of the frequency errors of the signals I, Q in the base band portion 20 will be described with reference to FIG. 7, When the input signal to the base band portion 20 is represented by I=cos ωt, Q=sin ωt as shown in FIG. 7, the difference signal between the following first and second signals is output from the base band portion 20. That is, the signal Q is delayed by a time τ in delay portion 20B, and then the signal Q thus delayed by the time τ is mixed with the signal I in multiplier 20C to achieve the first signal. Further, the signal I is delayed by a time τ in delay portion 20A, and then the signal I thus delayed by the time τ is mixed with the signal Q in multiplier 20D to achieve the second signal. The difference signal between the following first and second signals is output from subtracter 20E.

The difference Δ between the first and second signals can be represented by the following equation (1).

$$\Delta = \cos\omega t \cdot \sin\omega(t+\tau) - \sin\omega t \cdot \cos\omega(t+\tau) \qquad (1)$$

The above equation (1) is further represented as follows:

$$\begin{aligned}\Delta &= \cos\omega t(\sin\omega t \cdot \cos\omega\tau + \cos\omega t \cdot \sin\omega\tau) - \\ &\quad \sin\omega t(\cos\omega t \cdot \cos\omega\tau - \sin\omega t \cdot \sin\omega\tau) \\ &= \sin\omega\tau(\cos^2\omega t + \sin^2\omega t) \\ &= \sin\omega\tau\end{aligned}$$

Figure 8:
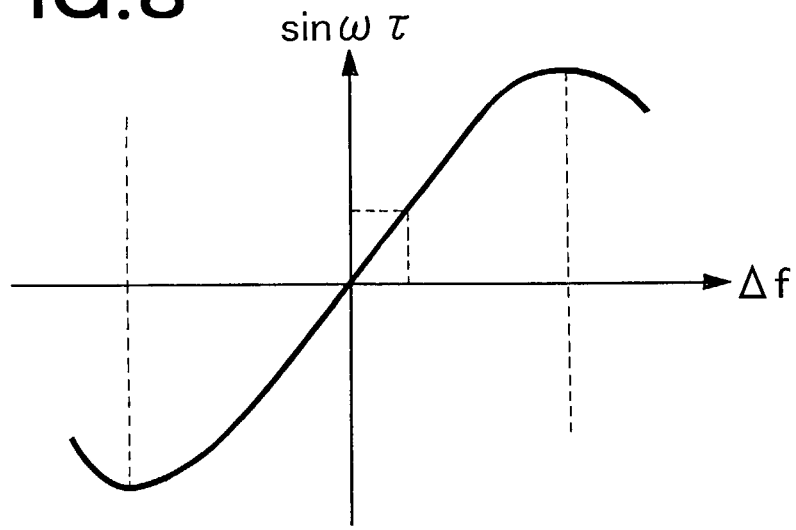
FIG. 8 is a graph showing the relationship between the measurement result of the base band portion and the frequency error of the crystal oscillation circuit portion.

Here, the difference Δ between the first and second signals (=sinωτ) has a characteristic as shown in the graph of FIG. 8, and this value increases as the frequency error Δf is increased. The difference Δ=sin ωτ is measured every fixed interval in the base band portion 20. When supplied with Δ=sin ωτ measured in the base band portion 20, the AFC portion 60 for the crystal oscillation circuit outputs to the crystal oscillation circuit portion 50 the voltage value for correcting the frequency error Δf corresponding to the measurement value. Accordingly, such a frequency signal that the frequency error Δf is equal to "0" is output from the crystal oscillation circuit portion 50, so that such frequency signals that the frequency error Δf is equal to "0" are also outputted from the PLL synthesizer portions 30, 40. Accordingly, the frequency error of the radio reception portion 10 for receiving and demodulating the radio signals on the basis of the output frequencies of the PLL synthesizer portions 30, 40 is also equal to "0".

As described above, on the assumption that the high-precision non-modulated reference frequency for correcting the crystal oscillation circuit is transmitted from the base station, the AFC portion 60 for the crystal oscillation circuit corrects the frequency of the crystal oscillation circuit portion 50 on the basis of the non-modulated reference frequency for the correction of the crystal oscillation circuit when the cellular phone terminal is powered on, and after the correction, the AFC portion 60 for the crystal oscillation circuit is switched to the AFC portion 70 to shift the communication state to the normal communication state. Therefore, the relatively cheap crystal oscillation circuit portion 50 can be used for the cellular phone terminal as a replacement for TCXO. Further, by performing the frequency correction on the basis of the reference frequency for correcting the crystal oscillation circuit, a temperature compensated circuit in TCXO may be omitted.

In the above described embodiment, the frequency of the crystal oscillation circuit portion 50 is corrected when the cellular phone terminal is powered on. In a following another embodiment, the frequency error of the crystal oscillation circuit portion 50 which is caused by temperature variation of the cellular phone terminal is periodically corrected when the AFC portion 60 for the crystal oscillation circuit is on standby.

Figure 9:
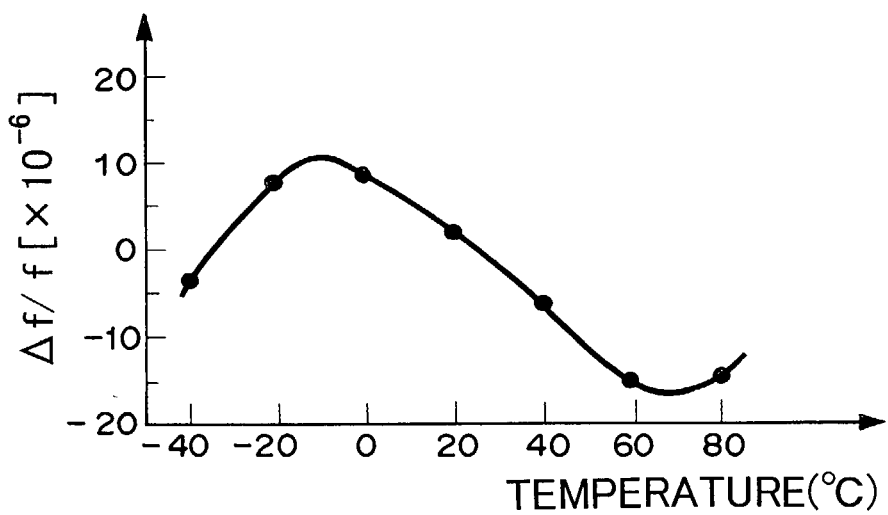
FIG. 9 is a graph showing the relationship between the frequency error of a crystal oscillation circuit having no temperature compensating circuit and the temperature.
Figure 10:
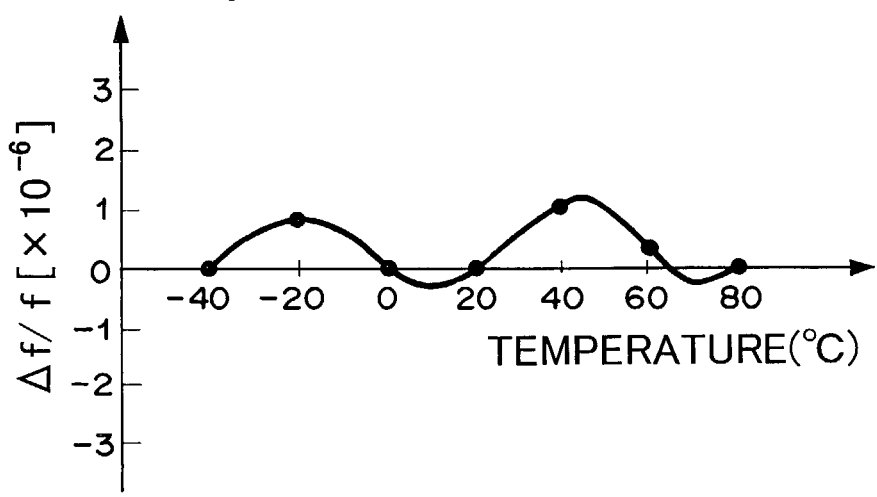
FIG. 10 is a graph showing the relationship between the frequency error of TCXO having a temperature compensating circuit and the temperature.

FIG. 9 is a graph showing the relationship between the temperature and the frequency error of the crystal oscillation circuit having no temperature compensated circuit. FIG. 10 is a graph showing the relationship between the temperature and the frequency error of TCXO (Temperature Compensated Crystal Oscillator) having a temperature compensating circuit. From the graphs of FIGS. 9 and 10, it is apparent that the variation of the frequency error caused by the temperature variation of the crystal oscillation circuit having no temperature compensating circuit is large.

Figure 11:
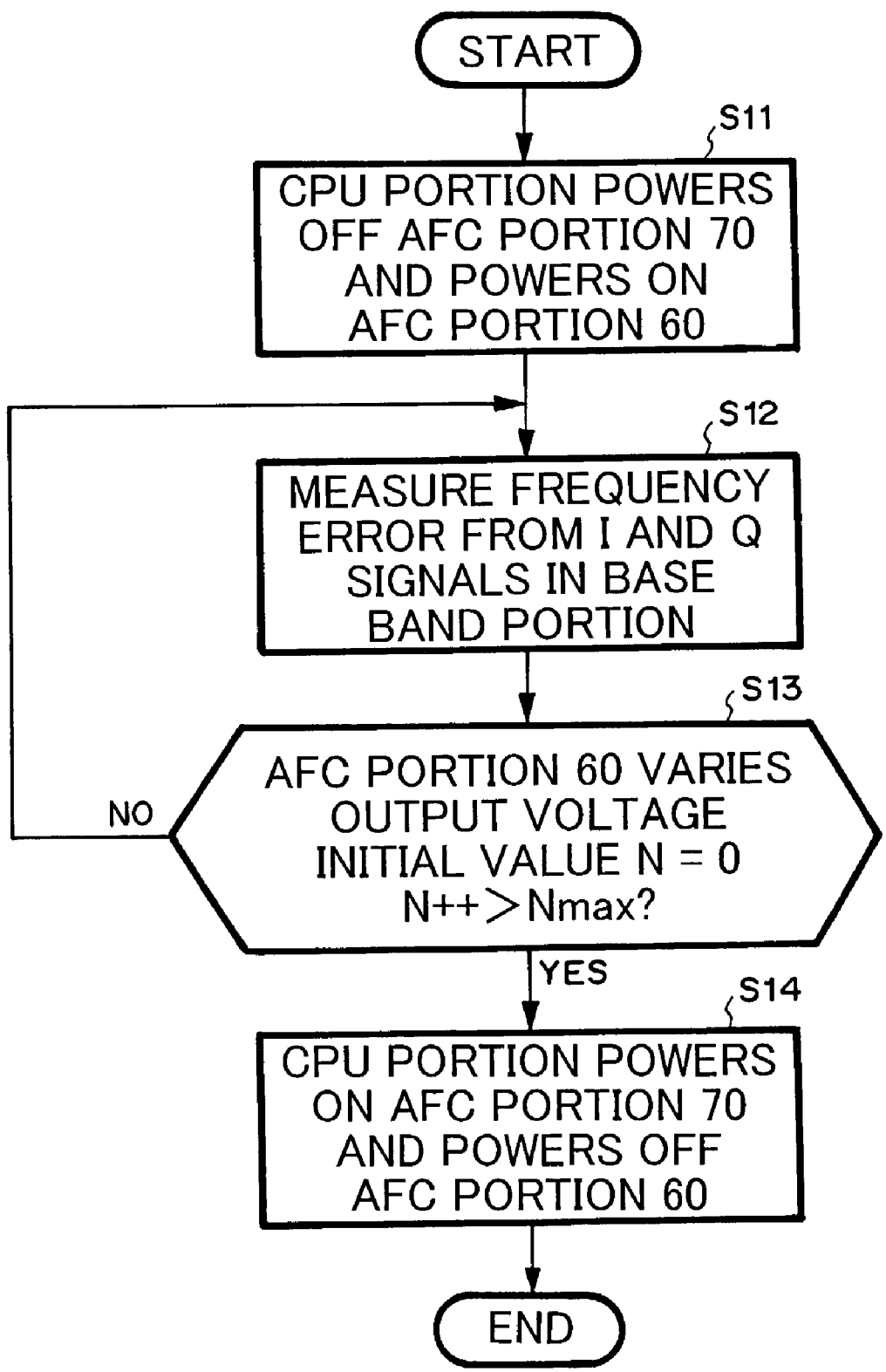
FIG. 11 is a flowchart showing a second operation of the portable terminal device.

FIG. 11 is a flowchart showing the correction operation of the frequency by the AFC portion 60 for the crystal oscillation circuit when the cellular phone terminal is on standby.

The operation of the another embodiment will be described with reference to the flowchart of FIG. 11 and the graphs of FIGS. 9 and 10.

In step S11 of FIG. 11 when the cellular phone terminal is on standby, the CPU portion 80 powers off the AFC portion 70 and powers on the AFC portion 60 for the crystal oscillation circuit. In this case, in step S12, the base band portion 20 measures the frequency errors of the demodulated signals I, Q of the radio reception portion 10 for receiving and demodulating the radio signals on the basis of the output frequencies of the PLL synthesizer portions 30, 40 which are based on the reference frequency for the crystal oscillation circuit from the base station. Subsequently, in step S13, the AFC portion 60 for the crystal oscillation circuit is supplied with the frequency error measured by the base band portion 20 and varies the crystal-oscillation-circuit controlling voltage in accordance with the frequency error thus supplied. That is, the AFC portion 60 for the crystal oscillation circuit supplies the crystal oscillation circuit portion 50 with the crystal-oscillation-circuit controlling voltage with which the frequency error is corrected.

The frequency errors of the demodulated signals I, Q (I, Q signals) of the radio reception portion 10 for receiving and demodulating the radio signals on the basis of the output frequencies of the PLL synthesizer portions 30, 40 are set to "0" by repetitively executing each processing of the steps S12, S13 described above at a preset number of times. When the processing of the step S12 and the processing of the step S13 as described above are repetitively executed at the preset number of times, the CPU portion 80 judges that the reception frequency of the radio reception portion 10 has been sufficiently corrected, so that it powers on the AFC portion 70 and powers off the AFC portion 60 for the crystal oscillation circuit in step S14, thereby shifting to the normal communication state under the control of the AFC portion 70.

As described above, on the assumption that the high-precision non-modulated reference frequency for the correction of the crystal oscillation circuit is transmitted from the base station, the AFC portion 70 is switched to the AFC portion 60 for the crystal oscillation circuit when the cellular phone terminal is on standby, and the frequency correction is carried out by the AFC portion 60 for the crystal oscillation circuit. After this correction, the AFC portion 60 for the crystal oscillation circuit is switched to the AFC portion 70 to shift the communication state to the normal communication state. Therefore, for example even when a large frequency error which cannot be corrected by the AFC portion 70 (conventional AFC portion) due to the temperature variation of the crystal oscillation circuit portion 50 occurs in the crystal oscillation circuit portion 50, the AFC portion 70 is switched to the AFC portion 60 for the crystal oscillation circuit to perform the frequency correction.

What is claimed is:

1. A frequency correcting method in a cellular phone terminal for communicating a radio signal with a base station, comprising:
   receiving a reference signal for correcting a reception frequency of the radio signal transmitted from said base station;
   using a first mode being a power on mode for correcting the reception frequency based on the reference signal at the time the cellular phone terminal is initially powered on;
   using a second mode being a normal communications mode for correcting the reception frequency based on the radio signal transmitted from said base station; and
   making normal communications with said base station after correcting the reception frequency;
   wherein the reference signal is transmitted as a non-modulated signal from the base station at a frequency that is in a non-communication guard band.

2. The method as claimed in claim 1, wherein said first mode additionally comprises a standby mode for correcting the reception frequency based on the reference signal after the cellular phone terminal is initially powered on.

3. A cellular phone method for communicating a radio signal with a base station, comprising:
   providing a radio reception portion for receiving the radio signal transmitted from said base station and demodulating the received radio signal,
   providing a base band portion for measuring the frequency error of the demodulated signal,
   providing a crystal oscillation circuit portion,
   bringing the frequency of a frequency signal outputted from said crystal oscillation circuit portion into correspondence with a frequency of a reference signal, the reference signal being a signal for correcting a reception frequency of the radio signal,
   supplying, by a first frequency correction portion, said crystal oscillation circuit portion with a first voltage for correcting the frequency error outputted from said base band portion while receiving the reference signal transmitted from the base station,
   supplying by a second frequency correction portion, the crystal oscillation circuit portion with a second voltage for correcting the frequency error outputted from said base band portion under normal communications in which said radio reception portion receives the radio signal, and
   correcting a frequency error of said radio reception portion on the basis of the frequency signal outputted from said crystal oscillation circuit portion.

4. A cellular phone terminal for communicating a radio signal with a base station, comprising:
   a radio reception portion for receiving the radio signal transmitted from said base station and demodulating the received radio signal,
   a base band portion for measuring the frequency error of the demodulated signal,
   a crystal oscillation circuit portion, control means for bringing the frequency of a frequency signal outputted from said crystal oscillation circuit portion into correspondence with a frequency of a reference signal, the reference signal being a signal for correcting a reception frequency of the radio signal,
   first frequency correction portion for supplying said crystal oscillation circuit portion with a first voltage for correcting the frequency error outputted from said base band portion while receiving the reference signal transmitted from the base station,
   second frequency correction portion for supplying the crystal oscillation circuit portion with a second voltage for correcting the frequency error outputted from said base band portion under normal communications in which said radio reception portion receives the radio signal, and
   synthesizer portions for correcting a frequency error of said radio reception portion on the basis of the frequency signal outputted from said crystal oscillation circuit portion.

5. The cellular phone terminal of claim 4,
   wherein the radio reception portion receives the reference signal as a non-modulated signal from the base station at a frequency that is in a non-communication guard band.

6. The cellular phone terminal of claim 4,
   wherein the control means causes the first frequency correction portion to supply the crystal oscillation circuit portion with the first voltage when the control means is powered on.

7. The cellular phone terminal of claim 6,
   wherein the control means allows the first frequency correction portion to vary the first voltage a specified number of times; and
   wherein, in the event that the control means determines that the first frequency correction portion has varied the first voltage the specified number of times, the control means powers off the first frequency correction portion and powers on the second frequency correction portion to cause the second frequency correction portion to supply the crystal oscillation circuit portion with the second voltage.

8. The cellular phone terminal of claim 4,
   wherein the control means causes the first frequency correction portion to supply the crystal oscillation circuit portion with the first voltage when the control means enters a standby mode.

9. The cellular phone terminal of claim 8,
wherein the control means allows the first frequency correction portion to vary the first voltage a specified number of times; and
wherein, in the event that the control means determines that the first frequency correction portion has varied the first voltage the specified number of times, the control means powers off the first frequency correction portion and powers on the second frequency correction portion to cause the second frequency correction portion to supply the crystal oscillation circuit portion with the second voltage.

10. A frequency correcting method for correcting a reception frequency of a cellular phone terminal, the cellular phone terminal having a radio reception portion, a base band portion, a crystal oscillation circuit portion, a CPU portion, a first frequency correction portion, a second frequency correction portion, and synthesizer portions, the cellular phone terminal in communication with a base station, the base station transmitting a reference signal at a reference frequency, the method comprising:
- receiving, by the radio reception portion, the reference signal;
- determining, by the base band portion, a frequency error of the reception frequency of the radio reception portion based on the received reference signal;
- supplying, by the first frequency correction portion, a first voltage to the crystal oscillation circuit portion based on the frequency error determined by the base band portion;
- providing, by the crystal oscillation circuit portion, an output frequency based on the first voltage supplied by the first frequency correction portion;
- correcting, by the synthesizer portions, the reception frequency of the radio reception portion based on the output frequency provided by the crystal oscillation circuit portion;
- varying a specified number of times, by the first frequency correction portion, the first voltage based on the frequency error determined by the base band portion;
- determining, by the CPU portion, when the first frequency correction portion has varied the first voltage the specified number of times; and
- supplying, by the second frequency correction portion, a second voltage to the crystal oscillation circuit portion in the event that the CPU portion determines that the first frequency correction portion has varied the first voltage the specified number of times.

11. The frequency correcting method of claim 10, wherein the step of supplying, by the first frequency correction portion, a first voltage to the crystal oscillation circuit portion based on the frequency error determined by the base band portion, comprises:
- supplying, by the first frequency correction portion, a first voltage to the crystal oscillation circuit portion based on the frequency error determined by the base band portion when the cellular phone terminal is powered on.

12. The frequency correcting method of claim 10, wherein the step of supplying, by the first frequency correction portion, a first voltage to the crystal oscillation circuit portion based on the frequency error determined by the base band portion, comprises:
- supplying, by the first frequency correction portion, a first voltage to the crystal oscillation circuit portion based on the frequency error determined by the base band portion when the cellular phone terminal is on standby.

* * * * *